United States Patent
Peng et al.

(10) Patent No.: US 9,030,013 B2
(45) Date of Patent: May 12, 2015

(54) INTERCONNECT STRUCTURES COMPRISING FLEXIBLE BUFFER LAYERS

(71) Applicant: Taiwan Semiconductor Manufacturing Company, Ltd., Hsin-Chu (TW)

(72) Inventors: Chao-Hsien Peng, Hsin-Chu (TW); Hsin-Yen Huang, Yonghe (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 13/624,766

(22) Filed: Sep. 21, 2012

(65) Prior Publication Data

US 2014/0084471 A1    Mar. 27, 2014

(51) Int. Cl.
*H01L 23/48* (2006.01)
*H01L 23/52* (2006.01)
*H01L 21/768* (2006.01)
*H01L 23/532* (2006.01)

(52) U.S. Cl.
CPC .... *H01L 23/53295* (2013.01); *H01L 21/76831* (2013.01); *H01L 21/76834* (2013.01); *H01L 23/53238* (2013.01); *H01L 23/5329* (2013.01)

(58) Field of Classification Search
USPC ........... 257/758, 762, 767, 301, E23.145
See application file for complete search history.

(56) References Cited

U.S. PATENT DOCUMENTS

| | | | | |
|---|---|---|---|---|
| 5,985,762 | A * | 11/1999 | Geffken et al. | 438/687 |
| 6,037,664 | A * | 3/2000 | Zhao et al. | 257/758 |
| 6,166,423 | A * | 12/2000 | Gambino et al. | 257/532 |
| 6,426,249 | B1 * | 7/2002 | Geffken et al. | 438/239 |
| 6,433,429 | B1 * | 8/2002 | Stamper | 257/751 |
| 6,472,721 | B2 * | 10/2002 | Ma et al. | 257/531 |
| 6,693,356 | B2 * | 2/2004 | Jiang et al. | 257/767 |
| 7,163,883 | B2 * | 1/2007 | Agarwala et al. | 438/598 |
| 7,923,806 | B2 * | 4/2011 | Watanabe | 257/503 |
| 2002/0019123 | A1 * | 2/2002 | Ma et al. | 438/622 |
| 2003/0067077 | A1 * | 4/2003 | Lee | 257/758 |
| 2005/0090094 | A1 * | 4/2005 | Oh et al. | 438/633 |
| 2005/0227479 | A1 * | 10/2005 | Feng et al. | 438/637 |
| 2007/0037385 | A1 * | 2/2007 | Huebinger et al. | 438/638 |
| 2007/0281091 | A1 * | 12/2007 | Kowalski et al. | 427/256 |
| 2009/0085173 | A1 * | 4/2009 | Boemmels et al. | 257/635 |

* cited by examiner

*Primary Examiner* — Nitin Parekh
(74) *Attorney, Agent, or Firm* — Slater & Matsil, L.L.P.

(57) ABSTRACT

A structure includes a substrate, a low-k dielectric layer over the substrate, and a conductive barrier layer extending into the low-k dielectric layer. The conductive barrier layer includes a sidewall portion. A metal line in the low-k dielectric layer adjoins the conductive barrier layer. An organic buffer layer is between the sidewall portion of the conductive barrier layer and the low-k dielectric layer.

20 Claims, 4 Drawing Sheets

INTERCONNECT STRUCTURES COMPRISING FLEXIBLE BUFFER LAYERS

BACKGROUND

Integrated circuits include interconnect structures, which comprises metal lines and vias to serve as three-dimensional wiring structures. The purpose of the interconnect structures is to properly link densely packed devices together. With increasing levels of integration, the parasitic capacitance between the metal features of interconnect structures, which parasitic capacitance leads to RC delay and crosstalk of signals, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

Copper has become the metal of choice over aluminum in the fabrication of integrated circuits. The reason is that copper has a lower resistance than aluminum, and hence allows for the scaling down of devices. Despite its advantages, the use of copper in interconnect structures poses several special problems that did not exist with the use of aluminum. One such problem is the occurrence of humps. Copper has a much higher Coefficient of thermal Expansion (CTE) than aluminum, so that it expands significantly when heated under typical temperatures used in semiconductor processing. Copper humps are the results of the expansion. Copper interconnect lines are typically formed by damascene processes, in which trench openings and via openings are formed in dielectric layers, and are then filled with copper. After a Chemical Mechanical Polish (CMP), the top surface of copper is leveled. In a subsequent formation of an etch stop layer that covers the copper, however, an elevated temperature is needed. When heated, copper is squeezed by the encircling materials, and hence expands upwardly to form humps, wherein the top surfaces of copper become higher than the top surface of the dielectric material in which the copper is located. The formation of the copper humps induces severe electro-migration of copper, and may result in the degradation in the performance of the resulting metal interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
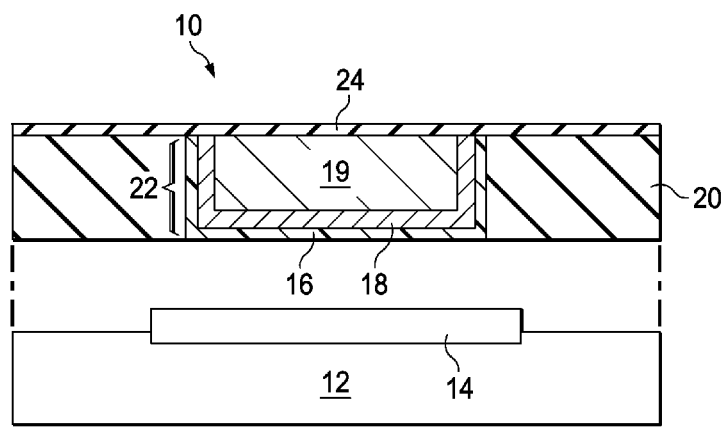
FIGS. 1 through 8 are cross-sectional views of intermediate stages in the manufacturing of an interconnect structure in accordance with some exemplary embodiments.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, III-V compound semiconductor materials, and/or the like. In some embodiments, integrated circuits 14 are formed at a top surface of semiconductor substrate 12. Integrated circuits 14 may include active devices such as transistors.

Over integrated circuit 14 is dielectric layer 20, and barrier layer 18 and conductive line 22 formed in dielectric layer 20. Dielectric layer 20 may be an Inter-Layer Dielectric (ILD) layer or an Inter-Metal Dielectric (IMD) layer, and may have low dielectric constants (k values) lower than about 2.5, for example. Conductive line 22 may include conductive barrier layer 18 and metal line 19 over barrier layer 18. In some embodiments, barrier layer 18 comprises titanium, titanium nitride, tantalum, tantalum nitride, copper manganese, alloys thereof, and/or multi-layers thereof. Metal line 19 may comprise copper, tungsten, aluminum, nickel, and/or alloys thereof. Conductive line 22 may be electrically coupled to integrated circuits 14 and may serve as the interconnection between the devices in integrated circuits 14. In some embodiments, buffer layer 16 is formed between, and may be in contact with, barrier layer 18 and dielectric layer 20. Buffer layer 16 may be formed of a flexible material such as a polymer, which may comprise polyimide (PI), polyamide-imide (PAI), and/or the like. In alternative embodiments, buffer layer 16 is not formed.

Etch Stop Layer (ESL) 24 is formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HD-PCVD), Atomic Layer CVD (ALCVD), and the like. In alternative embodiments, dielectric layer 24 is a diffusion barrier layer that is used for preventing undesirable elements, such as copper, from diffusing into the subsequently formed low-k dielectric layer. In further embodiments, dielectric layer 24 acts as both an etch stop layer and a diffusion barrier layer.

Figure 2:
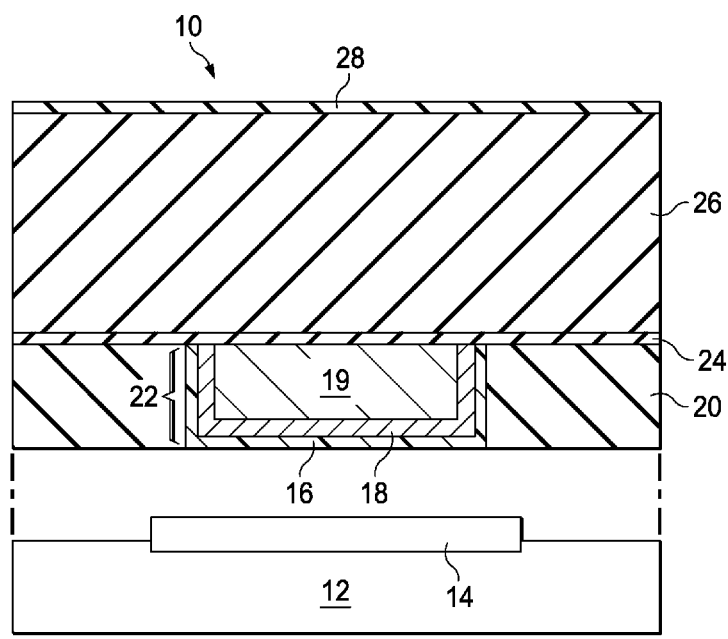

FIG. 2 illustrates the formation of low-k dielectric layer 26, which provides insulation between conductive line 22 and the overlying conductive lines that will be formed subsequently. Accordingly, low-k dielectric layer 26 is sometimes referred to as an Inter-Metal Dielectric (IMD) layer.

Low-k dielectric layer 26 may have a k value lower than about 3.5, or lower than about 2.5. The materials comprised in low-k dielectric layer 26 may include carbon-containing materials, organo-silicate glass, porogen-containing materials, and/or combinations thereof. Low-k dielectric layer 26 may be deposited using PECVD, although other commonly used deposition methods, such as Low Pressure CVD (LPCVD), ALCVD, and spin-on, can also be used.

Hard mask layer 28 is formed over low-k dielectric layer 26. Hard mask layer 28 may be a dielectric layer. In some embodiments, hard mask layer 28 comprises silicon nitride, silicon carbide, or the like.

Figure 3:
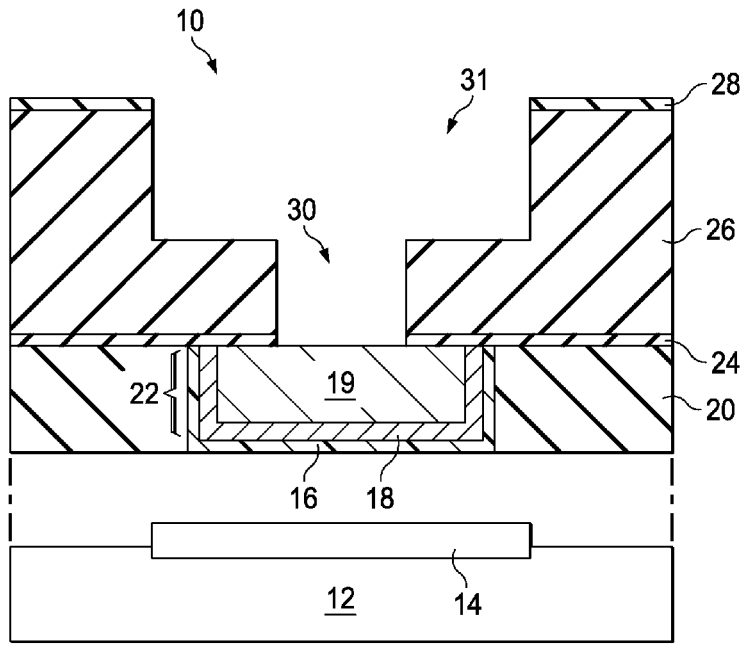

FIG. 3 illustrates the formation of via opening 30 and a trench opening 31 in low-k dielectric layer 26. Photo resists (not shown) are formed and patterned over low-k dielectric layer 26 to aid the formation of via opening 30 and trench opening 31. In some exemplary embodiments, an anisotropic etch is performed to cut through low-k dielectric layer 26, which anisotropic etch stops on ESL 24, thereby forming via opening 30. Trench opening 31 is then formed by etching low-k dielectric layer 26 using another patterned photo resist. Since there is no etch stop layer for stopping the etch step for forming trench opening 31, etching time is controlled so that the etch step for forming trench opening 31 stops at a desired depth. In alternative embodiments, a trench-first approach is taken, in which trench opening 31 is formed prior to the formation of via opening 30. ESL 24 is then etched through via opening 30, exposing underlying conductive line 22.

In alternative embodiments, the previously discussed low-k dielectric layer 26 is replaced by a first low-k dielectric layer (not shown), an ESL (not shown) on the first low-k dielectric layer, and a second low-k dielectric layer (not shown) on the ESL. One skilled in the art will realize the appropriate process steps.

Figure 4:
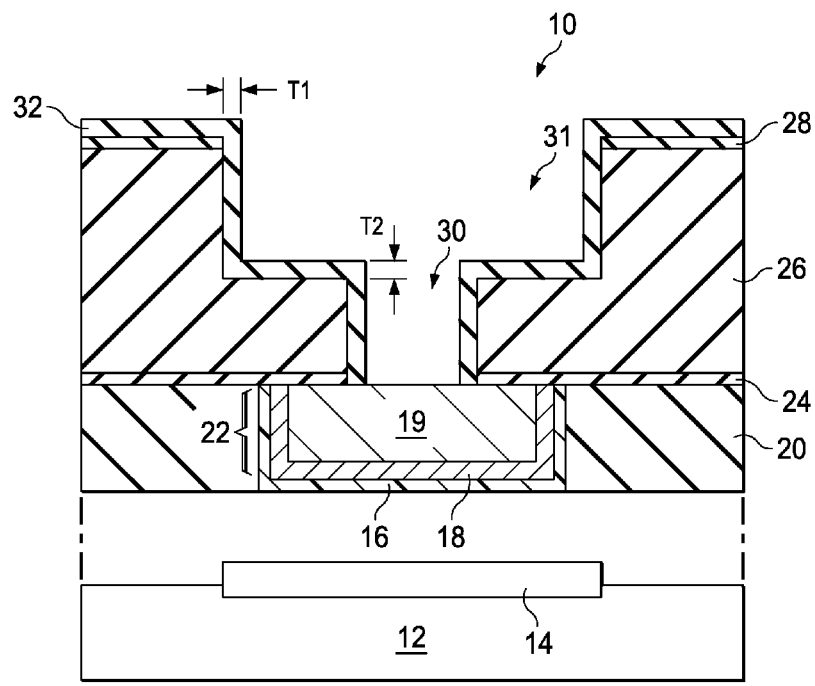

FIG. 4 illustrates the formation of buffer layer 32, which includes portions on the bottoms and sidewalls of openings 30 and 31, and portions over the top surface of hard mask layer 28. Buffer layer 32 may be an organic layer comprising an organic material. Furthermore, buffer layer 32 may be a dielectric layer. In some embodiments, buffer layer 32 comprises a polymer, although buffer layer 32 may also be a non-polymer layer. In some exemplary embodiments, buffer layer 32 comprises polyimide. In alternative embodiments, buffer layer 32 comprises polyimide, polyamide-imide, or the like. These materials have characteristics that are suitable for being used in the interconnect structure. For example, polyimide has a low k value (about 2.9), a low Coefficient of Thermal Expansion (CTE) (about 5 ppm/C°), a high modulus (about 8.5 GPa), a high elongation ratio (about 25 percent), a high glass transition temperature (Tg) and a thermal decomposition temperature (higher than about 400° C.). With the low k value, the polyimide is beneficial for reducing the parasitic capacitance in the interconnect structure. With a low CTE and a high elongation ratio, buffer layer 32 may absorb the expanded volume generated by copper-containing material 36 (FIG. 8) in the subsequent heating process. With a high modulus, the resulting interconnect structure is mechanically strong. With a high glass transition temperature Tg and thermal decomposition temperature, buffer layer 32 is stable in the subsequent heating processes. Thicknesses T1 and T2 of buffer layer 32 may be between about 1 and about 10 μm, although different thicknesses may be used.

Figure 5:
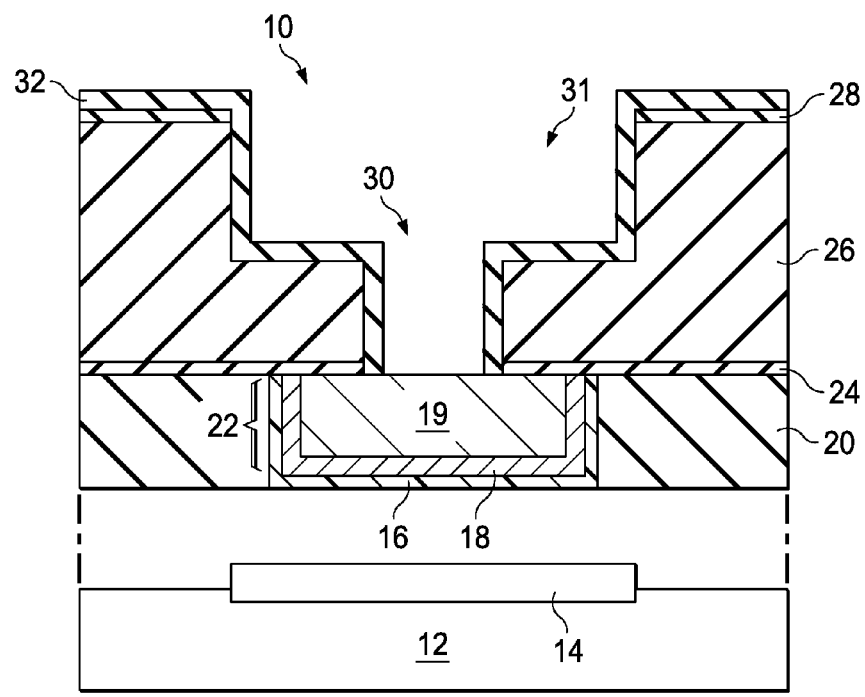

The formation of buffer layer 32 may comprise a coating process and a curing process. The coating process is controlled so that thickness T1 of the vertical portions of buffer layer 32 is close to thickness T2 of the horizontal portions of buffer layer 32. Accordingly, buffer layer 32 is substantially conformal, for example, with thickness T2 not greater than two times thickness T1. The curing may be a thermal curing or a Ultra-Violet (UV) curing. After the curing process, as shown In FIG. 5, a patterning step is performed, and the bottom portion of buffer layer 32 at the bottom of via opening 30 is removed to expose the underlying conductive line 22.

Figure 6:
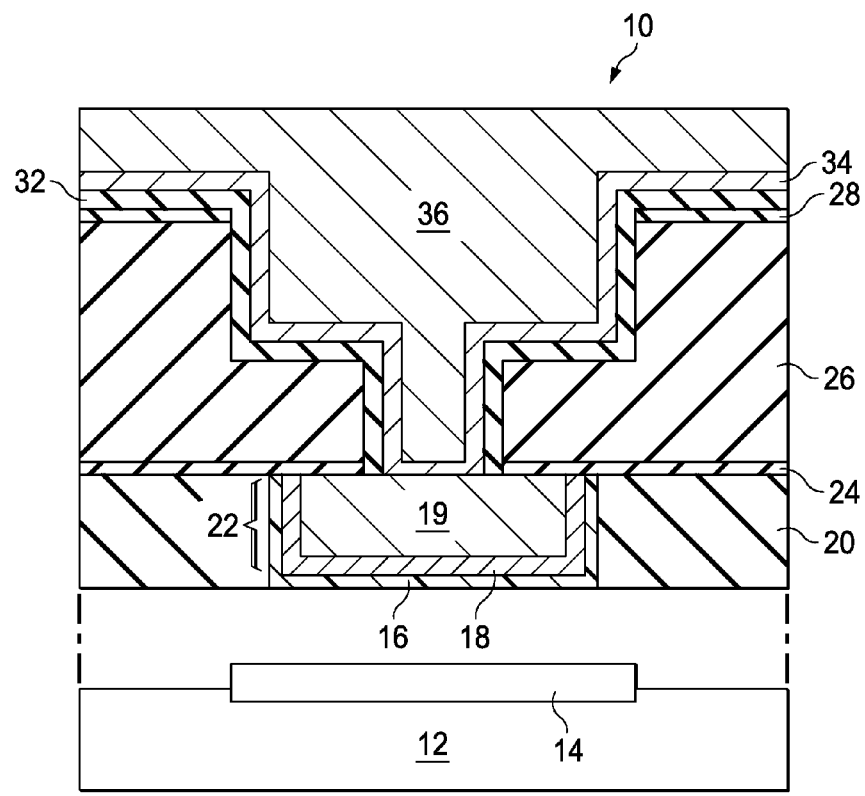

FIG. 6 illustrates the formation of conductive barrier layer 34 over buffer layer 32, and conductive material 36 over barrier layer 34. Conductive barrier layer 34 extends into openings 30 and 31 (FIG. 5), and includes a portion over buffer layer 32. Conductive barrier layer 34 also has a bottom portion contacting the top surface of conductive line 22. Barrier layer 34 may prevent the copper in conductive material 36 from diffusing into low-k dielectric layer 26. In some embodiments, conductive barrier layer 34 is formed of a conductive material comprising titanium, titanium nitride, tantalum, tantalum nitride, copper manganese, alloys thereof, or multilayers thereof.

As also shown in FIG. 6, the remaining portions of via opening 30 and trench opening 31 (FIG. 5) that are not occupied by conductive barrier 34 are filled with conductive material 36, which may be a copper-containing material such as substantially pure copper or copper alloys. Other metals and metal alloys such as aluminum and tungsten may also be used or added into copper. The top surface of conductive material 36 is higher than the top surface of conductive barrier layer 34.

Figure 7:
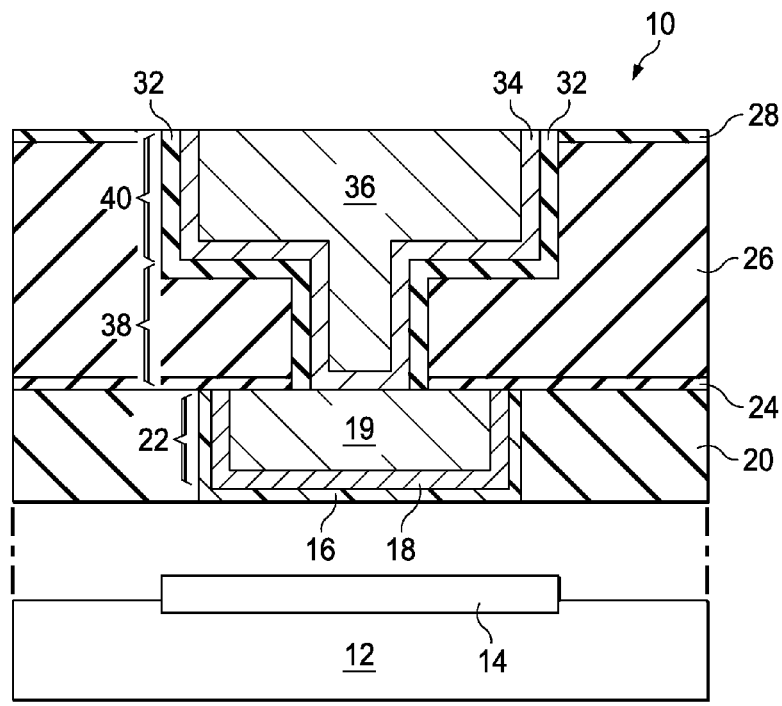

Referring to FIG. 7, a planarization such as Chemical Mechanical Polish (CMP) is then performed to remove excess conductive material 36, until the portions of conductive material 36 over the top surface of hard mask layer 28 are removed. Hard mask layer 28 may act as the polish stop layer in the planarization step. In the resulting structure, a dual damascene structure is formed, wherein the dual damascene structure includes via 38 and metal line 40. Each of via 38 and metal line 40 includes a respective portion of conductive material 36 and the corresponding underlying portions of barrier layer 34.

In the previously discussed embodiments, the formation of a dual damascene structure is illustrated. Similar process and materials as discussed in the embodiments can also be adopted in the formation of single damascene structures. For example, buffer layer 16 may comprise a same material, and may be formed using a method, as buffer layer 32. The process details may be realized referring to the discussion of buffer layer 32.

Figure 8:
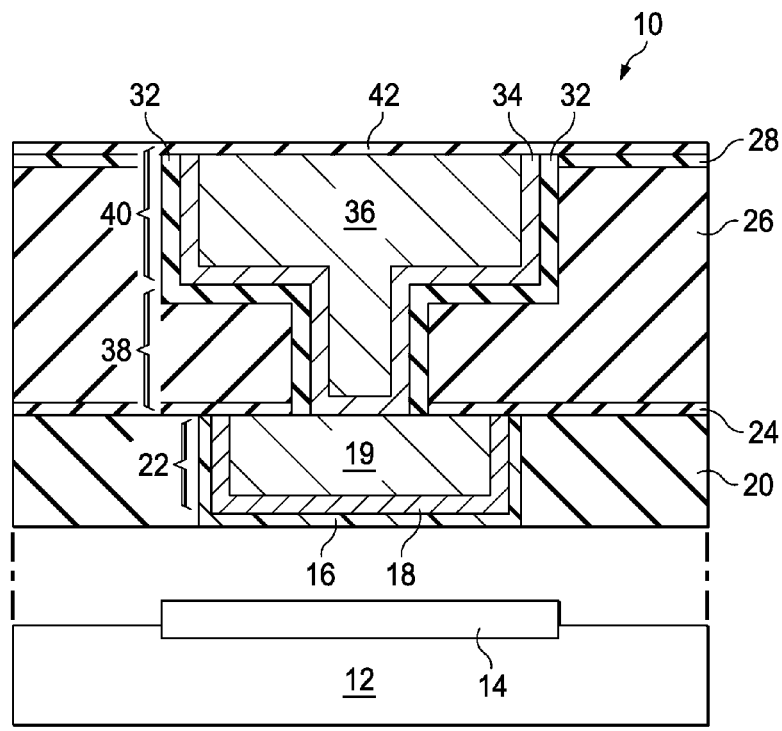

FIG. 8 illustrates the formation of ESL 42. In some embodiments, ESL 42 comprises a material selected from silicon nitride, silicon carbide, an oxide, an oxynitride, and the like. The formation may be performed through PECVD, for example. In the formation of ESL 42 and overlying structures, elevated temperatures may be used, which may range between about 200° C. and about 400° C. Since copper has a high CTE, it expands more than other surrounding materials such as low-k dielectric layer 26. Since buffer layer 32 is soft and has a high elongation ratio and a small CTE, it may yield space to via 38 and metal line 40 when via 38 and metal line 40 expand, so that via 38 and metal line 40 receive smaller squeezing force than when buffer layer 32 is not formed. With the smaller squeezing force, the hump of metal line 40, if any, will at least be smaller.

In accordance with embodiments, a structure includes a substrate, a low-k dielectric layer over the substrate, and a conductive barrier layer extending into the low-k dielectric layer. The conductive barrier layer includes a sidewall portion. A metal line in the low-k dielectric layer adjoins the conductive barrier layer. An organic buffer layer is between the sidewall portion of the conductive barrier layer and the low-k dielectric layer.

In accordance with other embodiments, a structure includes a semiconductor substrate, a low-k dielectric layer over the semiconductor substrate, and an opening extending from a top surface of the low-k dielectric layer into the low-k dielectric layer. A polymer layer is disposed in the opening, wherein the polymer layer includes a sidewall portion contacting a sidewall of the low-k dielectric layer. A conductive barrier layer is disposed in the low-k dielectric layer. A copper-containing metal feature is disposed in the low-k dielectric layer, wherein the conductive barrier layer is between and contacting the copper-containing metal feature and the polymer layer.

In accordance with yet other embodiments, a method includes forming an opening in a low-k dielectric layer, coating a polymer layer into the opening, and forming a conductive barrier layer over the polymer layer. The conductive barrier layer extends into the opening. A copper-containing metallic material is filled into a remaining portion of the opening. A planarization is performed to remove excess portions of the copper-containing metallic material, the conductive barrier layer, and the polymer layer, wherein the excess portions are outside the opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the present disclosure.

What is claimed is:

1. A structure comprising:
    a substrate;
    a first metal line over the substrate;
    a low-k dielectric layer over the first metal line;
    a conductive barrier layer extending into the low-k dielectric layer, wherein the conductive barrier layer comprises a sidewall portion, and a bottom portion underlying and connected to the sidewall portion, and wherein a portion of the conductive barrier layer comprises a bottom surface in contact with a top surface of the first metal line;
    a second metal line adjoining the conductive barrier layer and in the low-k dielectric layer; and
    an organic buffer layer comprising:
        a first portion between the sidewall portion of the conductive barrier layer and the low-k dielectric layer; and
        a second portion underlying and in contact with the bottom portion of the conductive barrier layer.

2. The structure of claim 1, wherein the first portion of the organic buffer layer comprises:
    a first sidewall contacting a sidewall of the sidewall portion of the conductive barrier layer; and
    a second sidewall contacting a sidewall of the low-k dielectric layer.

3. The structure of claim 1, wherein the organic buffer layer comprises a dielectric material.

4. The structure of claim 1, wherein the organic buffer layer comprises polyimide.

5. The structure of claim 1 further comprising a metal via underlying and connected to the second metal line, wherein the conductive barrier layer and the organic buffer layer further comprise via portions level with the metal via, and wherein the via portion of the organic buffer layer is between the via portion of the conductive barrier layer and the low-k dielectric layer.

6. The structure of claim 1, wherein a bottom edge of the organic buffer layer is in contact with the first metal line.

7. A structure comprising:
    a semiconductor substrate;
    a low-k dielectric layer over the semiconductor substrate;
    an opening extending from a top surface of the low-k dielectric layer into the low-k dielectric layer;
    a polymer layer in the opening, wherein the polymer layer comprises a sidewall portion contacting a sidewall of the low-k dielectric layer;
    a conductive barrier layer in the low-k dielectric layer;
    a copper-containing metal feature in the low-k dielectric layer, wherein the conductive barrier layer is between and contacting the copper-containing metal feature and the polymer layer; and
    a metal line over the semiconductor substrate and under the low-k dielectric layer, wherein the conductive barrier layer comprises a bottom surface in physical contact with the metal line.

8. The structure of claim 7 further comprising:
    a bottom portion of the conductive barrier layer overlapped by a metal line portion of the copper-containing metal feature; and
    a bottom portion of the polymer layer underlying and connected to the sidewall portion of the polymer layer, wherein the bottom portion of the polymer layer is overlapped by and contacting the bottom portion of the conductive barrier layer.

9. The structure of claim 8 further comprising a dielectric material underlying and contacting the bottom portion of the polymer layer.

10. The structure of claim 7, wherein the polymer layer comprises polyimide.

11. The structure of claim 7, wherein the polymer layer comprises polyimide (PI) or polyamide-imide (PAI).

12. The structure of claim 7, wherein the copper-containing metal feature comprises a metal line portion and a via portion underlying the metal line portion.

13. The structure of claim 7, wherein the conductive barrier layer comprises a sidewall portion and a bottom portion connected to a bottom end of the sidewall portion, and the polymer layer comprises a bottom portion underlying and in contact with the bottom portion of the conductive barrier layer.

14. The structure of claim 13, wherein the bottom portion of the polymer layer is overlapped by the bottom portion of the conductive barrier layer, and the copper-containing feature comprises a metal line portion and a via portion continuously connected to the metal line portion, and the bottom portion of the conductive barrier layer comprises a top surface in contact with the metal line portion, and a bottom surface contacting a top surface of the bottom portion of the polymer layer.

15. A structure comprising:
    a semiconductor substrate;
    a conductive line over the semiconductor substrate;
    a low-k dielectric layer over the conductive line;
    a polymer layer extending from a top surface to a bottom surface of the low-k dielectric layer, wherein the polymer layer comprises:
        a first sidewall portion; and
        a first bottom portion connected to a bottom end of the first sidewall portion;
    a metallic material between opposite portions of the polymer layer; and a conductive barrier layer extending from the top surface to the bottom surface of the low-k dielectric layer, wherein the conductive barrier layer is between the polymer layer and the metallic material, and the conductive barrier layer comprises:
   a second sidewall portion; and
   a second bottom portion, wherein the second bottom portion of the conductive barrier layer overlaps the first bottom portion of the polymer layer, and the conductive barrier layer comprises a bottom surface in contact with a top surface of the conductive line.

16. The structure of claim 15, wherein the metallic material comprises a metal line and a via underlying the metal line, and the first bottom portion of the polymer layer is under the metal line and over a majority of the via.

17. The structure of claim 16, wherein the second bottom portion of the conductive barrier layer comprises a top surface in contact with a bottom surface of the metal line, and a bottom surface in contact with a top surface of the first bottom portion of the polymer layer.

18. The structure of claim 15, wherein the polymer layer comprises polyimide (PI) or polyamide-imide (PAI).

19. The structure of claim 15, wherein the conductive barrier layer comprises a bottom surface, with a part of the bottom surface not in contact with the polymer layer.

20. The structure of claim 15, wherein the polymer layer has a glass transition temperature and a thermal decomposition temperature higher than about 400° C.

\* \* \* \* \*